(12) United States Patent
Lee et al.

(10) Patent No.: US 12,206,435 B2
(45) Date of Patent: Jan. 21, 2025

(54) INPUT IMPEDANCE BOOSTING APPARATUS ROBUST AGAINST PARASITIC COMPONENTS

(71) Applicant: Daegu Gyeongbuk Institute of Science and Technology, Daegu (KR)

(72) Inventors: Jung Hyup Lee, Daegu (KR); Se Hwan Lee, Chilgok-gun (KR)

(73) Assignee: Daegu Gyeongbuk Institute of Science and Technology, Daegu (KR)

( * ) Notice: Subject to any disclaimer, the term of this patent is extended or adjusted under 35 U.S.C. 154(b) by 189 days.

(21) Appl. No.: 18/170,228

(22) Filed: Feb. 16, 2023

(65) Prior Publication Data

US 2023/0261670 A1 Aug. 17, 2023

(30) Foreign Application Priority Data

Feb. 16, 2022 (KR) .................. 10-2022-0020298
Dec. 16, 2022 (KR) .................. 10-2022-0176566

(51) Int. Cl.
*H03M 3/00* (2006.01)
*H03M 1/06* (2006.01)
*H03M 1/12* (2006.01)

(52) U.S. Cl.
CPC ........... *H03M 3/458* (2013.01); *H03M 1/068* (2013.01); *H03M 3/35* (2013.01); *H03M 1/0607* (2013.01); *H03M 1/12* (2013.01); *H03M 3/356* (2013.01)

(58) Field of Classification Search
CPC ...... H03M 3/458; H03M 1/0607; H03M 3/35; H03M 1/12; H03M 3/356; H03M 1/068

USPC .................................................. 341/143, 155
See application file for complete search history.

(56) References Cited

U.S. PATENT DOCUMENTS

| | | | |
|---|---|---|---|
| 8,014,124 B2 | 9/2011 | Lin | |
| 8,599,053 B2* | 12/2013 | Quiquempoix | ......... H03F 3/005 |
| | | | 341/143 |
| 9,948,313 B1 | 4/2018 | Rafi | |
| 10,778,165 B2* | 9/2020 | Chandrakumar | ... H03F 3/45744 |

(Continued)

FOREIGN PATENT DOCUMENTS

KR 10-2015-0103843 A1 9/2015

OTHER PUBLICATIONS

Extended European Search Report dated Jul. 18, 2023 in European Application No. 23156895.7.

(Continued)

*Primary Examiner* — Khai M Nguyen
(74) *Attorney, Agent, or Firm* — Sughrue Mion, PLLC

(57) ABSTRACT

Disclosed is an input impedance boosting apparatus. More particularly, an input impedance boosting apparatus including an analog-to-digital converter; an input capacitor connected to an input terminal of the analog-to-digital converter and a ground line and including a first shielding metal formed thereunder; a feedback capacitor connected onto a positive feedback loop of the analog-to-digital converter and including a second shielding metal formed thereunder; and an impedance booster connected to both ends of the feedback capacitor and configured to boost an input impedance based on a first parasitic component formed between the input capacitor and the first shielding metal and a second parasitic component formed between the feedback capacitor and the second shielding metal is provided.

10 Claims, 7 Drawing Sheets

(56) References Cited

U.S. PATENT DOCUMENTS

| | | |
|---|---|---|
| 2015/0249445 A1 | 9/2015 | Dong et al. |
| 2017/0359542 A1 | 12/2017 | Bairo |
| 2020/0141989 A1 | 5/2020 | Hargreaves |

OTHER PUBLICATIONS

Lim et al. "A Capacitively Coupled CT Δ Σ M With Chopping Artifacts Rejection for Sensor Readout ICs", IEEE Transactions on Circuits and Systems—I: Regular Papers, 2021, vol. 68, No. 8, pp. 3242-3253 (12 pages total).

Alvarez-Fontecilla et al., "A Non-Linearity Compensation Technique for Charge-Redistribution SAR ADCs", 2019 IEEE Latin American Test Symposium (LATS), IEEE, 2019 (4 pages total).

Corentin Pochet et al., "A 400mVpp 92.3dB-SNDR IkHz-BW 2"d-Order VCO-Based ExG-to-Digital Front-End Using a Multiphase Gated-Inverted Ring-Oscillator Quantizer", ISSCC Dig. Tech. Papers, Feb. 18, 2021, pp. 392-394.

Jinseok Lee et al., "An Ultra-High Input Impedance Analog Front End Using Self-Calibrated Positive Feedback", IEEE Journal of Solid-State Circuits, Aug. 2018, pp. 2252-2262, vol. 53, No. 8.

Yongjae Park et al., "A 3.8-pW 1.5-NEF 15-G Total Input Impedance Chopper Stabilized Amplifier With Auto-Calibrated Dual Positive Feedback in 110-nm CMOS", IEEE Journal of Solid-State Circuits, Aug. 8, 2022, pp. 2449-2461, vol. 57, No. 8.

\* cited by examiner

[FIG. 1]
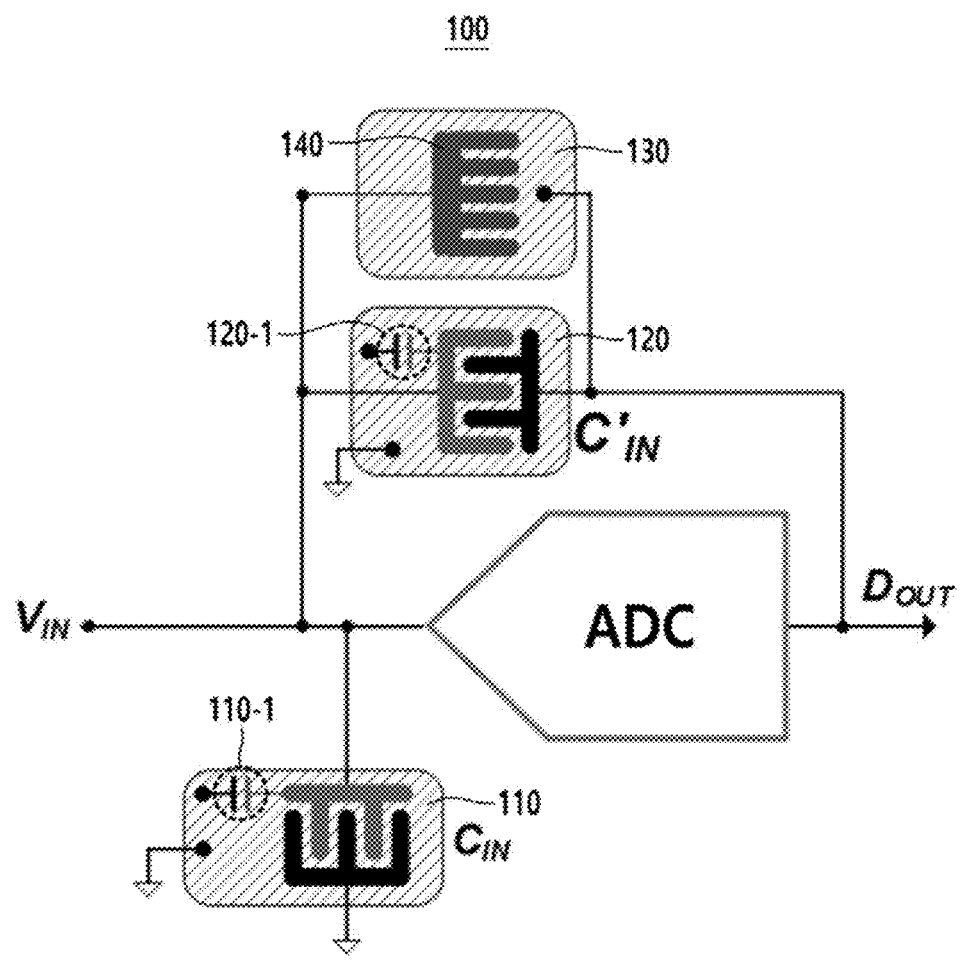

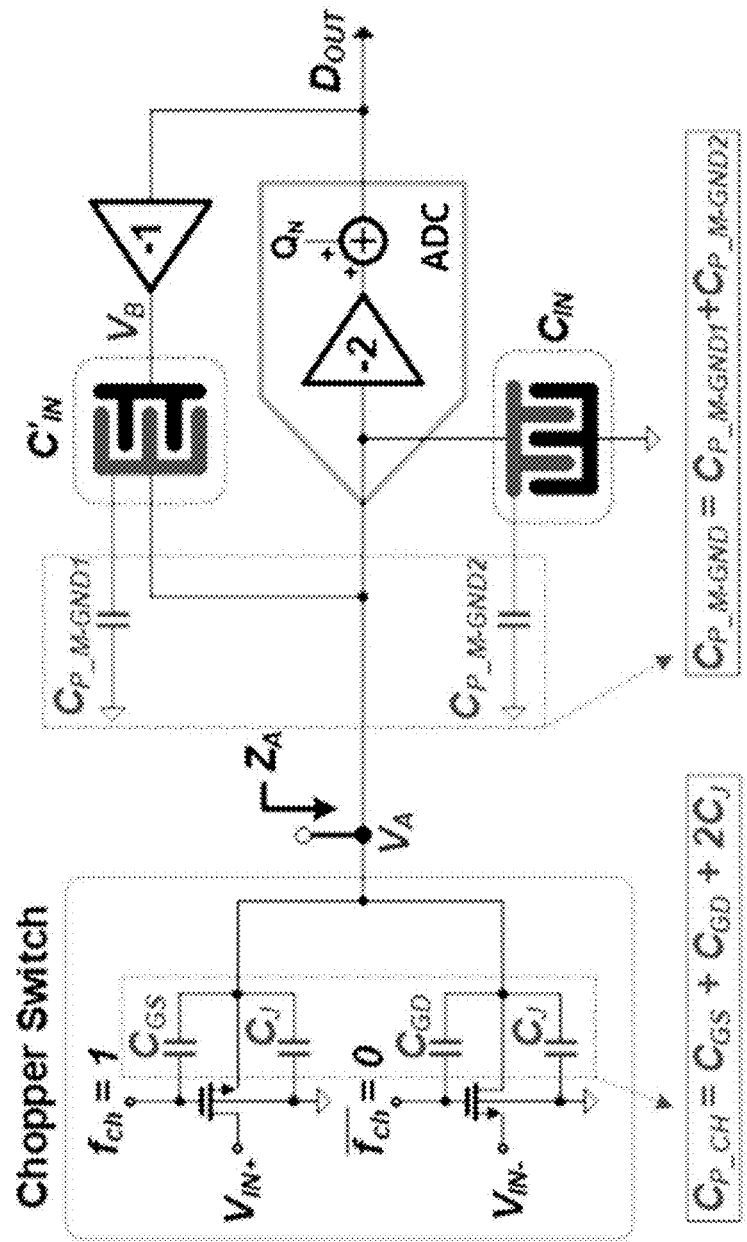
[FIG. 2A]

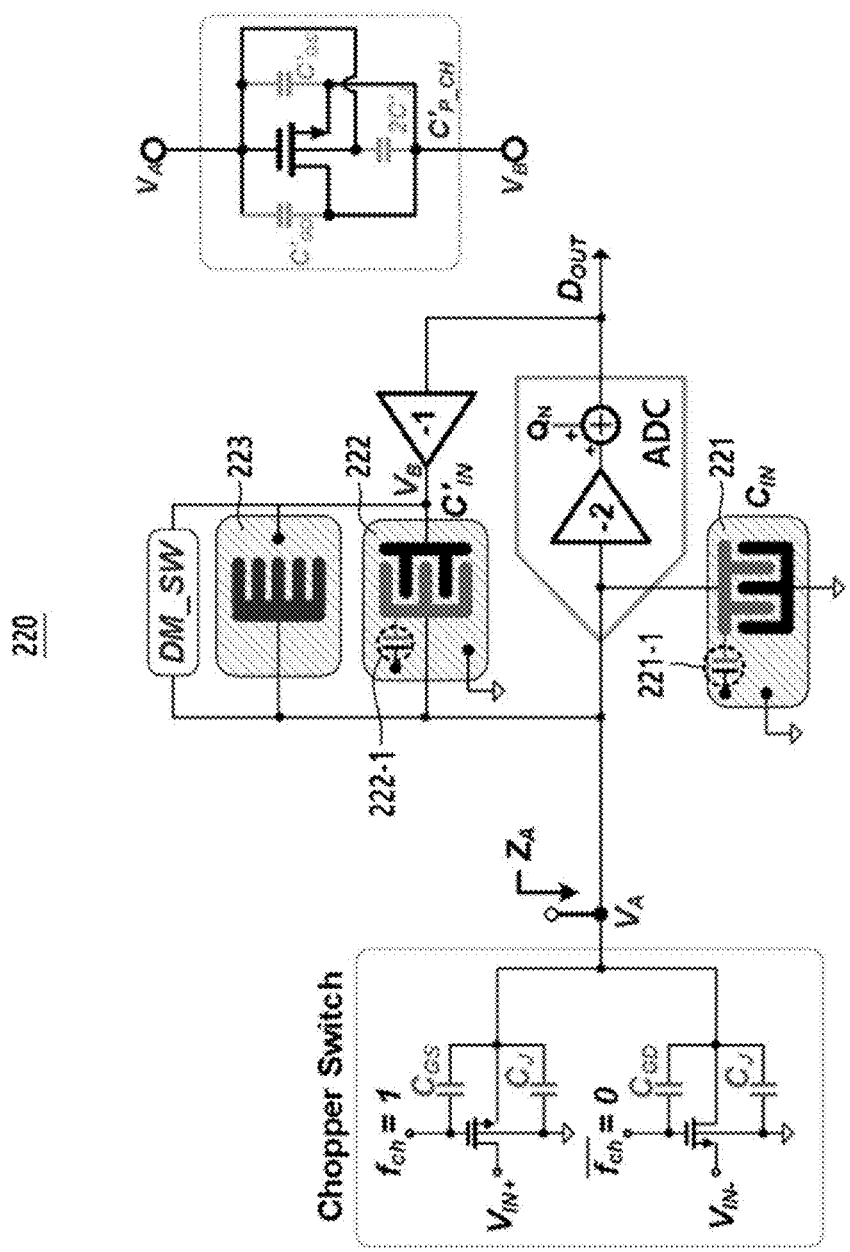
[FIG. 2B]

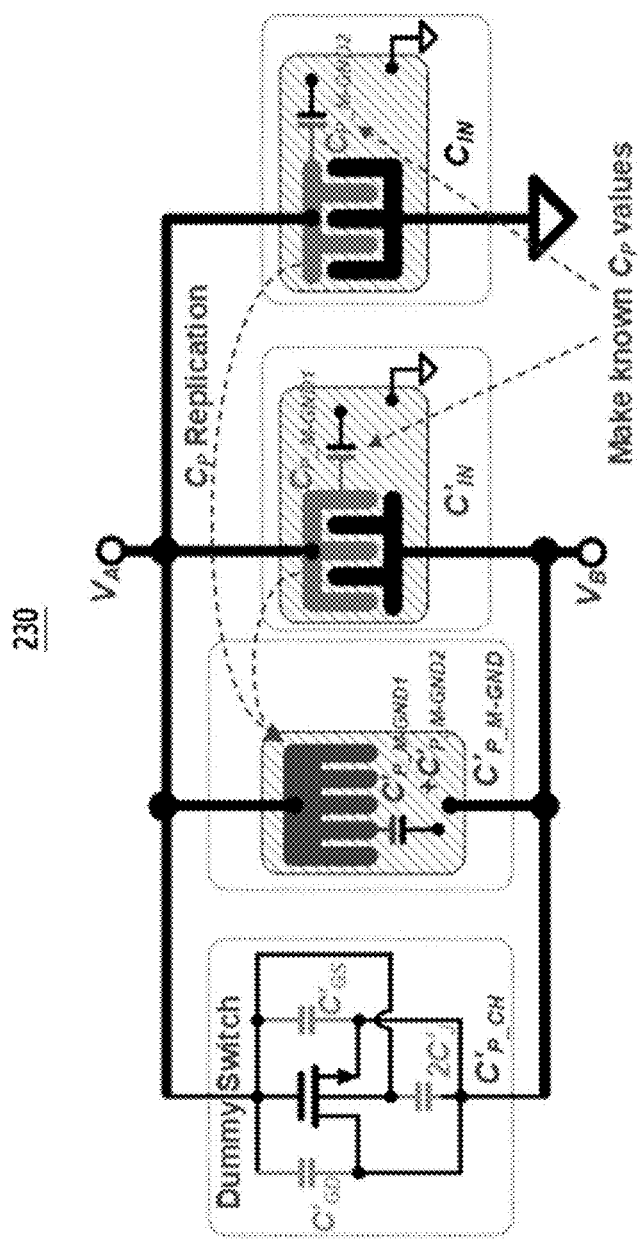

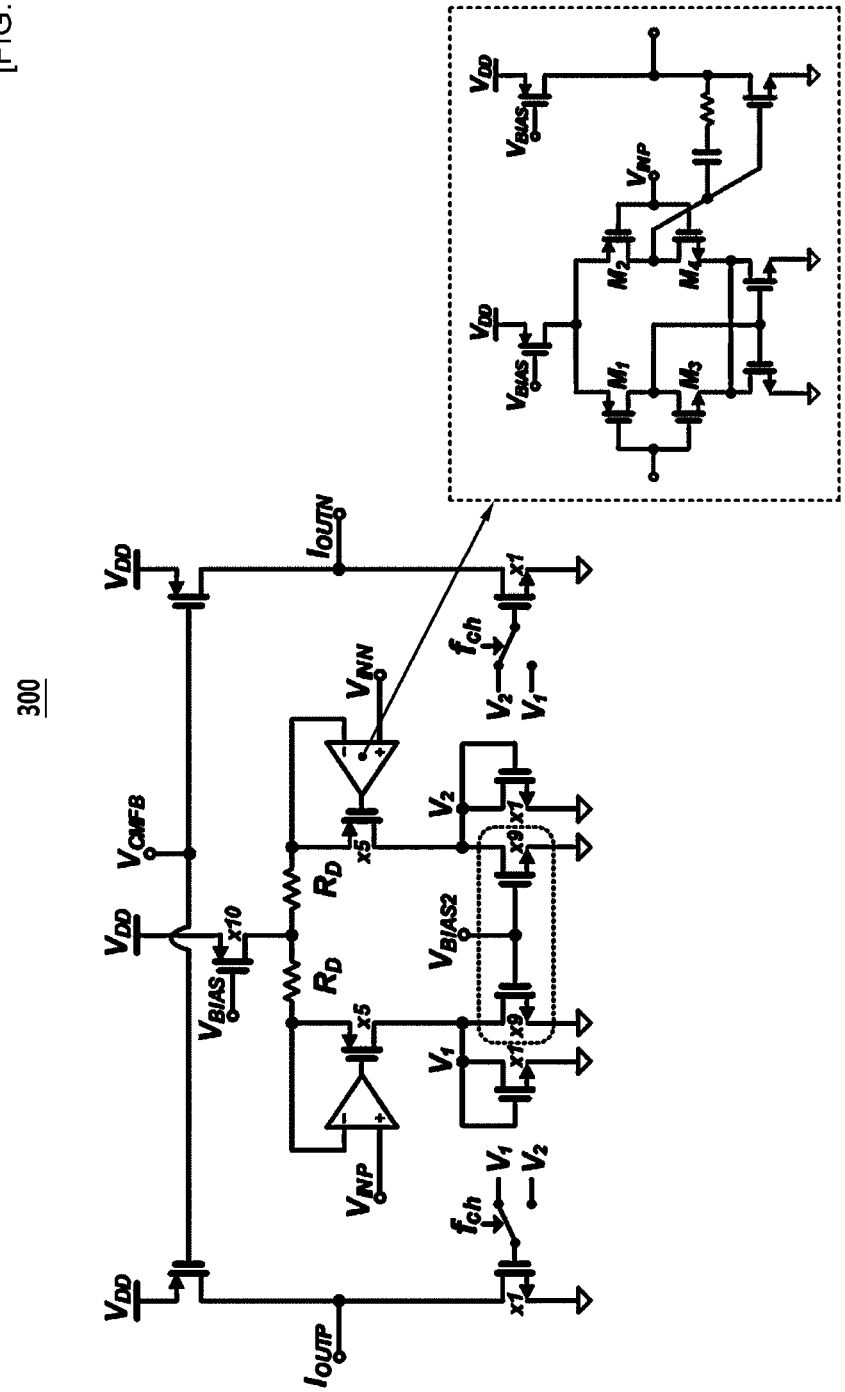

[FIG. 4]
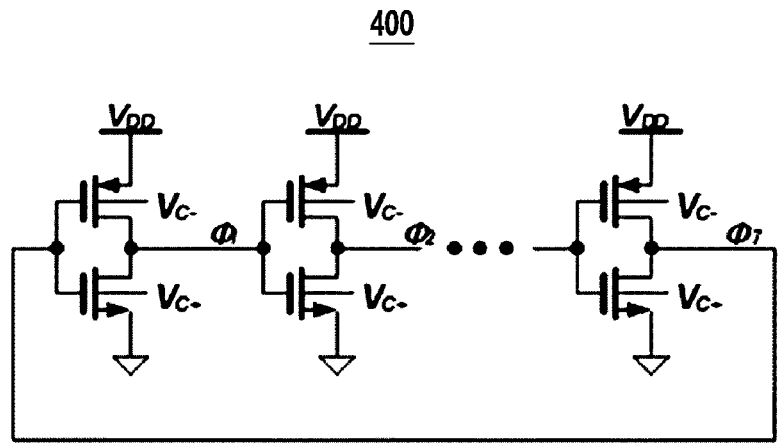
[FIG. 5A]
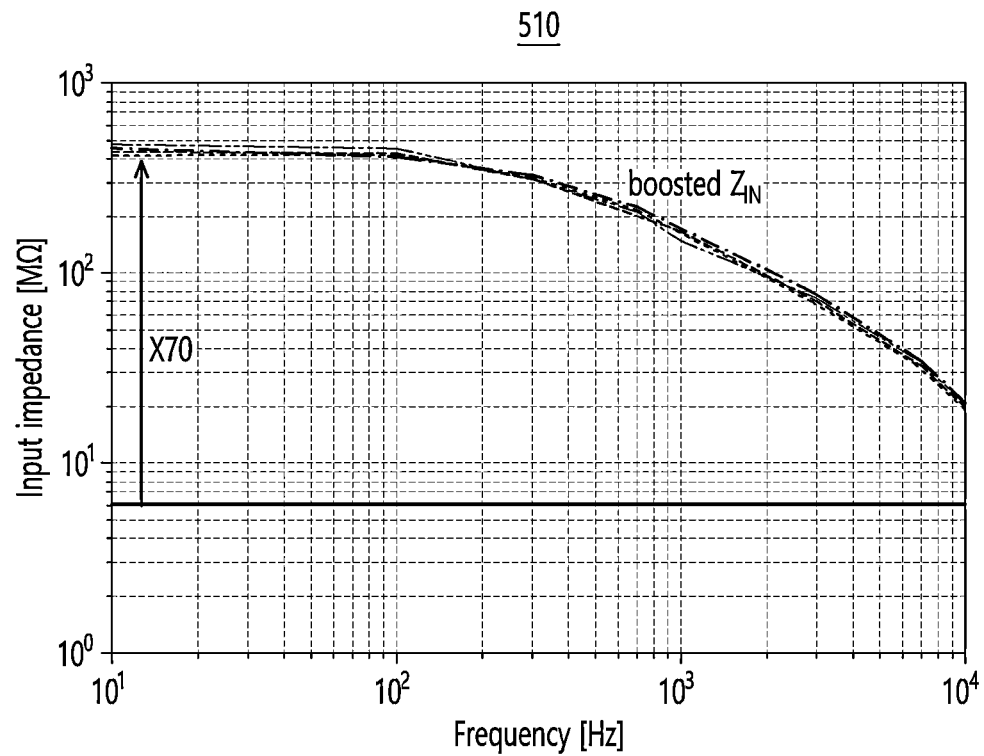

[FIG. 5B]
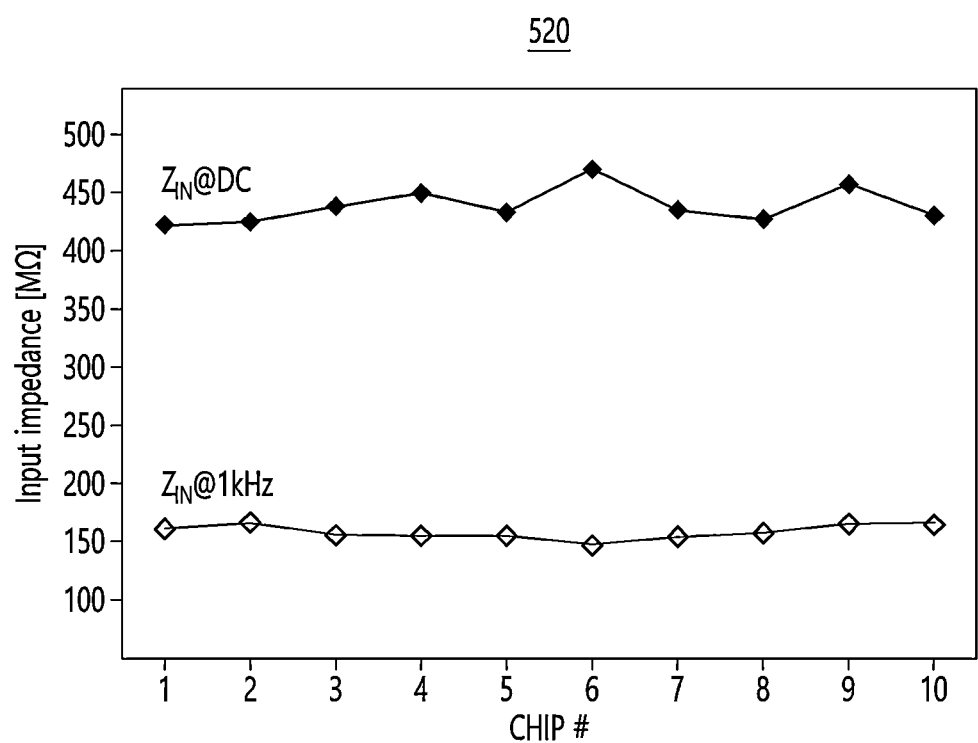

INPUT IMPEDANCE BOOSTING APPARATUS ROBUST AGAINST PARASITIC COMPONENTS

CROSS-REFERENCE TO RELATED APPLICATION

This application claims the priority benefit of Korean Patent Application No. 10-2022-0020298, filed on Feb. 16, 2022, and Korean Patent Application No. 10-2022-0176566, filed on Dec. 16, 2022, in the Korean Intellectual Property Office, the disclosure of each of which is incorporated herein by reference.

BACKGROUND OF THE INVENTION

1. Field of the Invention

The present disclosure relates to an input impedance boosting apparatus, and more particularly, to a technical idea of increasing the input impedance of a circuit by minimizing the effect of a parasitic capacitance component.

2. Description of the Related Art

In a voltage measurement circuit, an input impedance is an important performance indicator required to prevent signal attenuation, and an input impedance boosting circuit based on a positive feedback loop has been proposed to boost this input impedance.

In the above-described input impedance boosting circuit, a positive feedback loop is formed between an output terminal of the voltage measurement circuit and an input terminal thereof. Here, assuming that the gain of the voltage measurement circuit is 'A', the input impedance of a voltage measurement circuit is '$Z_{SEN}$', a parasitic component generated from a node (i.e., a node connected to the input terminal of the voltage measurement circuit) to which input voltage $V_{IN}$ is applied is '$Z_P$', and an impedance on a positive feedback loop for controlling feedback current $I_{FB}$ is '$Z_{FB}$', an input impedance is defined by a ratio of input voltage $V_{IN}$ to input current $I_{IN}$, and when there is no positive feedback loop, the input impedance may be expressed as '$Z_P + Z_{SEN}$'.

Here, the positive feedback loop serves to compensate for the input current $I_{IN}$, and a feedback current $I_{FB}$ applied to the positive feedback loop makes an infinite input impedance under the condition of $I_{FB} = I_P + I_{SEN}$, where $I_P$ is a current flowing to $Z_P$ (i.e., $C_P$), and $I_{SEN}$ is a current flowing to $Z_{SEN}$ (i.e., $C_{SEN}$)).

An input impedance increased (boosted) by the positive feedback loop may be expressed as in Equation 1 below:

$$Z_{IN} = \frac{V_{IN}}{I_{IN}} = \frac{1}{s} \cdot \frac{1}{(C_P + C_{SEN}) + (1 - A)C_{FB}} \quad \text{[Equation 1]}$$

As shown in Equation 1, the positive feedback loop generates a negative capacitance term of $(1-A)C_{FB}$, where $C_{FB}$ is $Z_{FB}$, and the input impedance is infinite under the condition of $(1-A)C_{FB} = C_P + C_{SEN}$. In addition, since A is defined as a parameter of the system (or device), the input impedance may be boosted by selecting an appropriate value of $C_{FB}$.

That is, existing input impedance boosting circuits are sensitive to parasitic components. In addition, since $C_{SEN}$, A, and $C_{FB}$ are parameters that can be accurately controlled, whereas $C_P$ is a parameter that is difficult to predict, the input impedance is limited by the parasitic component $C_P$ if $C_P$ cannot be invalidated.

Accordingly, in the existing technology, a method of trimming $C_{FB}$ was used to minimize the effect of $C_P$.

When using such a trimming method, a boosted input impedance is determined by a trimming resolution. In the case of the existing technology, an input capacitance of 60 fF, i.e., a high input impedance of 200GΩ@1 Hz, was achieved by using $C_{FB}$ as 9-bit $C_{DAC}$.

However, in the case of the existing technology of using the trimming method to boost an input impedance, there are problems in that an unnecessary area and power consumption are generated due to 9 bit $C_{DAC}$ and an additional circuit logic for trimming, and circuit complexity increases.

RELATED ART DOCUMENTS

Patent Document

Korean Patent Application Publication No. 10-2015-0103843, "RESERVE CAPACITOR".

Non-Patent Document

J. Lee, G. Lee, H. Kim and S. Cho, "An Ultra-High Input Impedance Analog Front End Using Self-Calibrated Positive Feedback," in IEEE Journal of Solid-State Circuits, vol. 53, no. 8, pp. 2252-2262, August 2018.

Y. Park, J.-H. Cha, S.-H. Han, J.-H. Park and S.-J. Kim, "A 3.8-µW/Ch, 15-GΩ Total Input Impedance Chopper Stabilized Amplifier with Dual Positive Feedback Loops and Auto-calibration Scheme," 2021 Symposium on VLSI Circuits.

SUMMARY OF THE INVENTION

Therefore, the present disclosure has been made in view of the above problems, and it is an object of the present disclosure to provide an input impedance boosting apparatus capable of reducing the effect of a parasitic capacitance component without additional calibration or trimming.

It is another object of the present disclosure to provide an input impedance boosting apparatus capable of boosting an input impedance while minimizing power consumption and an increase in cost according to a circuit area.

It is yet another object of the present disclosure to provide an input impedance boosting apparatus capable of achieving an improved impedance-boosting performance, compared to existing techniques using a trimming process.

In accordance with an aspect of the present disclosure, the above and other objects can be accomplished by the provision of an input impedance boosting apparatus, including: an analog-to-digital converter; an input capacitor connected to an input terminal of the analog-to-digital converter and a ground line and including a first shielding metal formed thereunder; a feedback capacitor connected onto a positive feedback loop of the analog-to-digital converter and including a second shielding metal formed thereunder; and an impedance booster connected to both ends of the feedback capacitor and configured to boost an input impedance based on a first parasitic component formed between the input capacitor and the first shielding metal and a second parasitic component formed between the feedback capacitor and the second shielding metal. ??.

According to an aspect, the impedance booster may boost the input impedance in a manner of copying the first parasitic component and the second parasitic component and adding the copied first and second parasitic components to the positive feedback loop.

According to an aspect, the impedance booster may include a first metal connected to a first terminal of the feedback capacitor; and a third shielding metal formed under the first metal and connected to a second terminal of the feedback capacitor.

According to an aspect, the first shielding metal and the second shielding metal may be respectively connected to a ground line.

According to an aspect, the input impedance boosting apparatus may further include a chopper switch connected to an input terminal of the analog-to-digital converter.

According to an aspect, the impedance booster may further include a dummy switch connected to both ends of the feedback capacitor.

According to an aspect, the impedance booster may boost the input impedance in a manner of copying a third parasitic component formed by the chopper switch through the dummy switch and of adding the copied third parasitic component to the positive feedback loop.

According to an aspect, the dummy switch may be formed to have a size equal to the chopper switch.

According to an aspect, the feedback capacitor and the input capacitor may be Metal-Oxide-Metal (MOM) capacitors.

According to an aspect, the analog-to-digital converter may be a continuous-time delta-sigma analog-to-digital converter including a linear integrator provided with a linear Gm cell and a quantizer provided with a body-driven VCO and a Frequency to Digital Converter (FDC).

BRIEF DESCRIPTION OF THE DRAWINGS

The above and other objects, features and other advantages of the present disclosure will be more clearly understood from the following detailed description taken in conjunction with the accompanying drawings, in which:

FIG. 1 is a diagram for explaining an input impedance boosting apparatus according to an embodiment;

FIGS. 2A to 2C are diagrams for more specifically explaining an input impedance boosting apparatus according to an embodiment;

FIG. 3 is a diagram for more specifically explaining a linear integrator according to an embodiment;

FIG. 4 is a diagram for more specifically explaining a body-driven VCO according to an embodiment; and FIGS. 5A and 5B are diagrams for explaining the performance simulation results of an input impedance boosting apparatus according to an embodiment.

DETAILED DESCRIPTION OF THE INVENTION

The embodiments will be described in detail herein with reference to the drawings.

However, it should be understood that the present disclosure is not limited to the embodiments according to the concept of the present disclosure, but includes changes, equivalents, or alternatives falling within the spirit and scope of the present disclosure.

In the following description of the present disclosure, a detailed description of known functions and configurations incorporated herein will be omitted when it may make the subject matter of the present disclosure unclear.

The terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general-purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless otherwise mentioned or clearly inferred from context, the expression "x uses a or b" means any one of natural inclusive permutations.

In the above-described specific embodiments, elements included in the disclosure are expressed singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

FIG. 1 is a diagram for explaining an input impedance boosting apparatus according to an embodiment.

Referring to FIG. 1, an input impedance boosting apparatus 100 according to an embodiment may reduce the effect of a parasitic capacitance component without additional calibration or trimming.

In addition, the input impedance boosting apparatus 100 may boost an input impedance while minimizing power consumption and an increase in cost according to a circuit area.

In addition, the input impedance boosting apparatus 100 may achieve an improved impedance boosting performance compared to an existing technology of using a trimming process.

For this, the input impedance boosting apparatus 100 may include an Analog-to-Digital Converter (ADC), an input capacitor $C_{IN}$, a feedback capacitor $C_{IN}$ and an impedance booster.

For example, the ADC may be an analog-to-digital converter having a gain value of '2' or '−2' or a Continuous-Time Delta-Sigma Modulator (CTDSM).

Specifically, the input capacitor $C_{IN}$ according to an embodiment may be connected to an input terminal and ground line of the ADC, and a first shielding metal 110 may be formed on a lower part of the input capacitor $C_{IN}$.

In addition, the feedback capacitor $C'_{IN}$ may be connected onto a positive feedback loop of a delta-sigma modulator, and a second shielding metal 120 may be formed on a lower part of the feedback capacitor $C'_{IN}$.

For example, the first shielding metal 110 and the second shielding metal 120 may be respectively connected to a ground line and may be spaced apart from each other by a gap having a preset size under the corresponding capacitor.

In addition, the input capacitor $C_{IN}$ and the feedback capacitor $C'_{IN}$ may be metal-oxide-metal (MOM) capacitors.

An impedance booster according to an embodiment may be connected to the feedback capacitor $C'_{IN}$ and may boost the input impedance based on a first parasitic component 110-1 formed between the input capacitor $C_{IN}$ and the first shielding metal 110 and a second parasitic component 120-1 formed between the feedback capacitor $C'_{IN}$ and the second shielding metal 120.

According to an aspect, impedance boosters 130 and 140 may boost the input impedance in a manner of copying the first parasitic component 110-1 and the second parasitic component 120-1 and adding the same to the positive feedback loop.

According to an aspect, the impedance boosters 130 and 140 may include a first metal 140 connected to a first terminal of the feedback capacitor $C'_{IN}$; and a third shielding metal 130 formed under the first metal 140 and connected to a second terminal of the feedback capacitor $C_{IN}$.

For example, the third shielding metal 130 may be formed under the first metal 140 to be spaced apart from the first metal 140 by a preset-sized gap.

The input impedance boosting apparatus 100 may further include a chopper switch connected to the input terminal of the ADC. In other words, the chopper switch may be provided between the input terminal of the ADC and a node to which the input voltage $V_{IN}$ is applied.

According to an aspect, the impedance booster may further include a dummy switch connected to both ends of the feedback capacitor $C'_{IN}$.

Specifically, the impedance booster may boost the input impedance in a manner of copying a third parasitic component formed by the chopper switch through the dummy switch and adding the same to a positive feedback loop. For example, the dummy switch may be formed to have the same size as the chopper switch.

Meanwhile, the ADC may be a continuous-time delta-sigma analog-to-digital converter including a linear integrator provided with a linear Gm cell and a quantizer provided with a body-driven VCO and a Frequency to Digital Converter (FDC).

Specifically, the linear integrator may generate a first output signal corresponding to the input voltage $V_{IN}$ based on the operation of the linear Gm cell that receives the preset input voltage $V_{IN}$.

In addition, the quantizer may generate a second output signal corresponding to the first output signal based on the operation of the body-driven VCO that receives the first output signal and may generate a digital output code $D_{OUT}$ corresponding to the second output signal based on the operation of FDC that receives the second output signal.

More specifically, the ADC is a $1^{st}$ order CTDSM composed of the linear integrator 110 having low-noise characteristics and high linearity characteristics and a quantizer based on the body-driven VCO and may achieve low quantization noise characteristics within a signal bandwidth due to the inherent noise characteristics of the VCO-based quantizer while having high stability characteristics as characteristics of the 1st order loop.

That is, the ADC may maximize the main performances, such as noise performance, linearity and a bandwidth, of the entire system by improving noise-power efficiency and linearity of the integrator and the VCO-based quantizer.

According to an aspect, the ADC may further include a 4-tap FIR filter provided on a delta-sigma feedback loop that connects the input terminal of the linear integrator and the output terminal of the quantizer.

For example, the delta-sigma feedback loop may be a positive feedback loop.

Specifically, the input impedance of the ADC is determined by a chopping frequency $f_{CH}$ at an input capacitor $C_{IN}$ provided between the input terminal of the linear integrator 210 and a ground line and a node connected to the input terminal of the linear integrator 210 and, in the case of existing devices, a chopping frequency is equal to fs or used as fs/2, where fs is a sampling frequency, to prevent aliasing of quantization noise due to chopping.

However, in this case, there is a problem of having a low input impedance of 1 MΩ or less due to a high sampling frequency. To solve this problem, the ADC may generate notches in quantization noise by connecting a 4-tap FIR filter onto a feedback loop.

More specifically, the ADC filters the quantization noise of a frequency band in which aliasing occurs through the 4-tap FIR filter to prevent the aliasing of quantization noise caused by chopping.

In addition, the ADC uses a notch frequency of fs/8 generated through the 4-tap FIR filter as a chopping frequency, thereby increasing the input impedance by 4 times compared to an existing device.

FIGS. 2A to 2C are diagrams for more specifically explaining an input impedance boosting apparatus according to an embodiment.

Referring to FIGS. 2A to 2C, Reference numeral 210 illustrates a parasitic capacitance component to be considered in an input impedance boosting apparatus, and Reference numerals 220 and 230 more specifically illustrate the input impedance boosting apparatus according to an embodiment.

According to Reference numeral 210, the input impedance boosting apparatus according to an embodiment uses a method of copying (imitating) a parasitic capacitance component without trimming and of adding the copied parasitic capacitance component to a positive feedback loop to minimize the effect of the parasitic capacitance component. For this, the input impedance boosting apparatus may consider a parasitic capacitor component '$C_{P\_CH}$' generated in the chopper switch and a parasitic capacitor component '$C_{P\_M\text{-}GND}$' generated in the input capacitor $C_{IN}$ and the feedback capacitor $C'_{IN}$, as main parasitic capacitances.

Specifically, an input impedance boosting apparatus may implement infinite impedance when a system gain is '−2' and the feedback capacitor $C'_{IN}$ satisfies the condition of Equation 2 below:

$$C'_{IN} = C_{IN} + \underbrace{C_{P\_CH} + C_{P\_M\text{-}GND}}_{\text{Parasitic Replication}} \quad \text{[Equation 2]}$$

According to Reference numerals 220 and 230, the input impedance boosting apparatus according to an embodiment may use a parasitic replication technique to copy the above-described parasitic capacitance component through Reference numeral 210.

To copy a parasitic capacitance by a Metal-Oxide-Metal (MOM)-type capacitor ($C_{IN}/C'_{IN}$), the input impedance boosting apparatus may include a shielding metal formed under the MOM capacitor. In this case, the parasitic capacitance component '$C_{P\_M\text{-}GND}$' is defined by an overlap area between the shielding metal and a metal layer of the MOM capacitor and may be easily copied.

In addition, the input impedance boosting apparatus may copy the parasitic capacitance component '$C_{P\_CH}$' by using a dummy switch having the same size as the chopper switch and may minimize the effect of the parasitic capacitor and achieve 70 times higher impedance compared to the conventional cases by using the above-described manner.

Specifically, the input impedance boosting apparatus may include a chopper switch, an ADC connected to the chopper switch, an input capacitor $C_{IN}$ on which a first shielding metal 221 is formed, and a feedback capacitor positioned on $C'_{IN}$ a positive feedback loop and including a second shielding metal 222 formed thereunder.

In addition, the input impedance boosting apparatus may further include an impedance booster for boosting input impedance based on a first parasitic component 221-1 connected to both ends of the feedback capacitor $C'_{IN}$ and formed between the input capacitor $C_{IN}$ and the first shielding metal 221 and a second parasitic component 222-1 formed between the feedback capacitor $C'_{IN}$ and the second shielding metal 222. For this, the impedance booster may include a first metal connected to the first terminal of the feedback capacitor $C'_{IN}$ and a third shielding metal 223 formed under the first metal and connected to the second terminal of the feedback capacitor $C'_{IN}$.

According to an aspect, the impedance booster may boost the input impedance in a manner of copying the first parasitic component 221-1 and the second parasitic component 222-1 and adding the same to the positive feedback loop.

More specifically, in the input impedance boosting apparatus, the parasitic capacitance components 221-1 and 222-1 may be controlled by respectively disposing the first shielding metal 221 and second shielding metal 222, connected to a ground line, under the input capacitor $C_{IN}$ and the feedback capacitor $C'_{IN}$ as MOM capacitors.

Here, each of the parasitic capacitance components 221-1 and 222-1, i.e., the parasitic capacitance components $C_{P\_GND1}$ and $C_{P\_M\text{-}GND2}$, may be an overlap capacitance generated by a metal layer of each of the MOM capacitors and a shielding metal of each thereof.

That is, in the input impedance boosting apparatus, a metal ground parasitic capacitance component may be added around the feedback capacitor $C'_{IN}$ to remove (offset) the parasitic effect caused by the parasitic capacitance components $C_{P\_GND1}$ and $C_{P\_M\text{-}GND2}$.

In other words, the input impedance boosting apparatus may minimize influence of the parasitic capacitance components $C_{P\_GND1}$ and $C_{P\_M\text{-}GND2}$ by copying the parasitic capacitance components $C_{P\_GND1}$ and $C_{P\_M\text{-}GND2}$ (i.e., $C_{P\_GND}=C'_{P\_GND1}+C'_{P\_GND2}$) using an impedance booster including the first metal connected to the first terminal of the feedback capacitor $C'_{IN}$ and the third shielding metal 223 formed under the first metal and connected to the second terminal of the feedback capacitor $C'_{IN}$ and by reflecting the copied parasitic capacitance components to the positive feedback loop.

Meanwhile, the impedance booster may further include a dummy switch connected to both ends of the feedback capacitor $C'_{IN}$ and formed to have the same size as the chopper switch and may minimize the influence of the parasitic capacitance component ($C_{P\_CH}$) by copying (i.e., $C'_{P\_CH}$) the third parasitic component (i.e., $C_{P\_CH}=C_{GS}+C_J+C_{GD}+C_J$) formed by the chopper switch through the dummy switch and by reflecting the copied third parasitic component to the positive feedback loop.

FIG. 3 is a diagram for more specifically explaining a linear integrator according to an embodiment.

Referring to FIG. 3, a linear integrator 300 according to an embodiment is a first entity to which the input of an analog-to-digital converter (ADC) according to an embodiment is applied and plays a major role in determining system noise and linearity, so it may be designed to have low noise and high linearity.

The linear integrator 300 according to an embodiment may generate first output signals $I_{OUTN}$, $I_{OUTP}$ corresponding to input voltages $V_{INN}$, $V_{INP}$ based on the operation of a linear Gm cell 310 receiving preset input voltages $V_{INN}$, $V_{INP}$.

The linear Gm cell 310 may include a plurality of operational amplifiers 311 and a plurality of resistors RD connected to an input terminal of each of the OPAMPs 311, and the plural resistors RD may be respectively connected to the OPAMPs 311 through one side end of each of the plural resistors RD and may be respectively connected to a power supply voltage VDD line through another side end of each of the plural resistors RD.

In addition, the linear integrator 300 may further include a DC-current source 320 connected to an output terminal of the linear Gm cell 310.

Meanwhile, in the linear integrator 300, each of the OPAMPs 311 may be designed as current-recycling OPAMP to improve noise power efficiency.

The input voltage $V_{INP}$ may be received through gate terminals of transistors M2 and M4 among a plurality of transistors constituting the OPAMPs 311, and the input voltage $V_{INN}$ may be received through gate terminals of transistors M1 and M3 among the transistors. Here, the transistors M1 to M4 may operate as a transconductance amplifier based on the input voltages $V_{INN}$ and $V_{INP}$.

According to an aspect, the linear integrator 300 may generate a linearly changing current by copying the input voltages $V_{INN}$, $V_{INP}$ to both ends of the plural resistors RD by a unit gain feedback in the linear Gm cell 310 and may generate a first output signal corresponding to a change in the generated current.

Specifically, the linear integrator 300 may generate output currents $I_{OUTN}$, $I_{OUTP}$ by copying the linear current change generated by the linear Gm cell 310 to an output terminal by the NMOS transistor, and, since the generated output currents $I_{OUTN}$, $I_{OUTP}$ flow into a load capacitor of the linear integrator 300, linearity may be maintained. Here, the output currents $I_{OUTN}$, $I_{OUTP}$ may be converted to a corresponding voltage (i.e., first output signal) by the load capacitor.

FIG. 4 is a diagram for more specifically explaining a body-driven VCO according to an embodiment.

Referring to FIG. 4, the quantizer included in the ADC may generate a second output signal corresponding to the first output signal based on the operation of the body-driven VCO 400 that receives the first output signal output from the linear integrator and may generate a digital output code $D_{OUT}$ corresponding to the second output signal based on the operation of FDC that receives the second output signal.

Specifically, in the case of the conventional gate-driven VCO, a change in output frequency is caused by a change in delay of each inverter delay-cell, and this delay change is generated by a change in the current of the PMOS transistor.

Here, the input voltage $V_C$ of the gate-driven VCO is applied to a gate terminal of the PMOS transistor, and the $G_m$ characteristic of the PMOS transistor greatly affects the linearity. That is, since the $G_m$ of a PMOS transistor has a nonlinear characteristic, a change in output frequency with respect to the input voltage of the gate-driven VCO has a nonlinear characteristic.

On the other hand, in the case of the body-driven VCO 400, input voltages $V_{C+}$, $V_{C-}$ are applied to a body terminal of the inverter delay-cell, unlike the existing gate-driven VCO, whereby the change in the delay of the inverter delay-cell is caused by a change in a threshold voltage of each of the PMOS transistor and NMOS transistor constituting the inverter delay-cell due to a change in the body voltage.

That is, a change in output frequency versus input voltage of the body-driven VCO 400 according to an embodiment is caused by the $G_{mb}$ characteristic of each transistor, and since $G_{mb}$ has linear characteristics compared to $G_m$, the body-driven VCO according to an embodiment may secure linear characteristics than the existing gate-driven VCO.

FIGS. 5A and 5B are diagrams for explaining the performance simulation results of an input impedance boosting apparatus according to an embodiment.

Referring to FIGS. 5A and 5B, Reference numerals 510 and 520 illustrate input impedance ($Z_{IN}$) measurement results of the input impedance boosting apparatus according to an embodiment.

Specifically, in the input impedance boosting apparatus according to an embodiment, a first shielding metal and second shielding metal connected to a ground line are respectively disposed under an input capacitor and a feedback capacitor as MOM capacitors, a first metal is disposed to be connected to the first terminal of the feedback capacitor, and a third shielding metal is formed under the first metal and connected to the second terminal of the feedback capacitor $C'_{IN}$, so that a parasitic capacitance component due to the input capacitor and the feedback capacitor may be controlled.

In addition, in the input impedance boosting apparatus according to an embodiment, a dummy switch is connected to the feedback capacitor and is formed to have the same size as the chopper switch, so that a parasitic capacitance component caused by the chopper switch may be controlled.

According to Reference numerals 510 and 520, it was confirmed that the input impedance boosting apparatus according to an embodiment obtains a boosting effect 70 times or more when compared to the theoretical value (unboosted $Z_{IN}$).

In addition, as a result of measuring 10 multi-chips, it was confirmed that the input impedance boosting apparatus according to an embodiment achieved an input impedance of at least 421MΩ@DC, 147MΩ@1 kHz and only 7% of the area of the entire system was consumed to apply the parasitic replication technique according to one embodiment.

In conclusion, by using the present disclosure, the effect of a parasitic capacitance component can be reduced without additional calibration or trimming.

In addition, by using the present disclosure, an input impedance may be boosted while minimizing power consumption and an increase in cost according to a circuit area.

In addition, by using the present disclosure, an improved impedance boosting performance, compared to existing techniques using a trimming process, can be achieved.

According to an embodiment, the present disclosure can reduce the effect of a parasitic capacitance component without additional calibration or trimming.

According to an embodiment, the present disclosure can boost an input impedance while minimizing power consumption and an increase in cost according to a circuit area.

According to an embodiment, the present disclosure can achieve an improved impedance-boosting performance, compared to existing techniques using a trimming process.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOLS

| | | | |
|---|---|---|---|
| 100: | input impedance boosting apparatus | | |
| ADC: | analog-to-digital converter | | |
| $C_{IN}$: | input capacitor | C'IN: | feedback capacitor |
| 110: | first shielding metal | 110-1: | first parasitic component |
| 120: | second shielding metal | 120-1: | second parasitic component |
| 130: | third shielding metal | 140: | first metal |

What is claimed is:

1. An input impedance boosting apparatus, comprising:
an analog-to-digital converter;
an input capacitor connected to an input terminal of the analog-to-digital converter and a ground line and comprising a first shielding metal formed thereunder;
a feedback capacitor connected onto a positive feedback loop of the analog-to-digital converter and comprising a second shielding metal formed thereunder; and
an impedance booster connected to both ends of the feedback capacitor and configured to boost an input impedance based on a first parasitic component formed between the input capacitor and the first shielding metal and a second parasitic component formed between the feedback capacitor and the second shielding metal.

2. The input impedance boosting apparatus according to claim 1, wherein the impedance booster boosts the input impedance in a manner of copying the first parasitic component and the second parasitic component and adding the copied first and second parasitic components to the positive feedback loop.

3. The input impedance boosting apparatus according to claim 1, wherein the impedance booster comprises a first metal connected to a first terminal of the feedback capacitor; and a third shielding metal formed under the first metal and connected to a second terminal of the feedback capacitor.

4. The input impedance boosting apparatus according to claim 1, wherein the first shielding metal and the second shielding metal are respectively connected to a ground line.

5. The input impedance boosting apparatus according to claim 1, further comprising a chopper switch connected to an input terminal of the analog-to-digital converter.

6. The input impedance boosting apparatus according to claim 4, wherein the impedance booster further comprises a dummy switch connected to both ends of the feedback capacitor.

7. The input impedance boosting apparatus according to claim 6, wherein the impedance booster boosts the input impedance in a manner of copying a third parasitic component formed by the chopper switch through the dummy switch and of adding the copied third parasitic component to the positive feedback loop.

8. The input impedance boosting apparatus according to claim 6, wherein the dummy switch is formed to have a size equal to the chopper switch.

9. The input impedance boosting apparatus according to claim 1, wherein the feedback capacitor and the input capacitor are Metal-Oxide-Metal (MOM) capacitors.

10. The input impedance boosting apparatus according to claim 1, wherein the analog-to-digital converter is a continuous-time delta-sigma analog-to-digital converter comprising a linear integrator provided with a linear Gm cell and a quantizer provided with a body-driven VCO and a Frequency to Digital Converter (FDC).

* * * * *